United States Patent [19]

Itoh et al.

[11] Patent Number: 5,658,824
[45] Date of Patent: Aug. 19, 1997

[54] METHOD OF FABRICATING A SEMICONDUCTOR LASER DEVICE

[75] Inventors: Shigetoshi Itoh; Toshiyuki Okumura, both of Tenri, Japan

[73] Assignee: Sharp Kabushiki Kaisha, Osaka, Japan

[21] Appl. No.: 521,905

[22] Filed: Aug. 31, 1995

[30] Foreign Application Priority Data

Aug. 31, 1994 [JP] Japan .................................. 6-206928

[51] Int. Cl.$^6$ .................................................. H01L 21/203
[52] U.S. Cl. ........................... 438/38; 438/39; 438/780
[58] Field of Search ............................... 437/129, 126, 437/133, 965; 148/DIG. 64, DIG. 95

[56] References Cited

U.S. PATENT DOCUMENTS

| | | |
|---|---|---|
| 5,084,894 | 1/1992 | Yamamoto . |
| 5,366,927 | 11/1994 | Schetzina .......................... 437/129 |
| 5,395,791 | 3/1995 | Cheng et al. ...................... 437/129 |
| 5,538,918 | 7/1996 | Haase et al. ....................... 437/129 |

FOREIGN PATENT DOCUMENTS

| | | |
|---|---|---|
| 63-122187 | 5/1988 | Japan . |
| 1-298784 | 12/1989 | Japan . |
| WO 93/24980 | 12/1993 | WIPO . |

OTHER PUBLICATIONS

Itoh et al., "Room temperature pulsed operation of 498nm lasers" *Extended Abstracts of the 1993 International Conference on Solid State Devices and Materials*, Makjuhari, (Aug. 29, 1993 to Sep. 1, 1993) Tokyo, Japan, pp. 53–55.

Sato et al., "Low thermal expansion polymide buried ridge waveguide AlGaAs/GaAs single-quantum-well laser diode" *Journal of Applied Physics* (1988) 63(3):964–966.

Salokatve et al., "Low voltage, room temperature, ridge waveguide green–blue diode laser" *Electronics Letters* (1993) 29(23):2041–2042.

Itoh et al., "Room temperature pulsed operation of 498nm laser with ZnMgSSe cladding layers" *Electronics Letters* (1993) 29(9):766–768.

*The Journal of the Institute of Electronics, Information and Communication Engineers* "Success in oscillation of a blue–green semiconductor laser at room temperature" (Jul. 1993) p. 818.

*Primary Examiner*—R. Bruce Breneman
*Assistant Examiner*—Ramamohan Rao Paladugu
*Attorney, Agent, or Firm*—Morrison & Foerster LLP

[57] ABSTRACT

A semiconductor laser device includes: a lower cladding layer; an upper cladding layer having a bottom and a strip-shaped ridge portion projecting from the bottom; a II-VI compound semiconductor active layer interposed between the lower cladding layer and the upper cladding layer; and a burying blocking layer made of an aromatic polyamide resin formed on a bottom of the upper cladding layer so as to be in contact with sides of the stripe-shaped ridge portion.

5 Claims, 3 Drawing Sheets

METHOD OF FABRICATING A SEMICONDUCTOR LASER DEVICE

BACKGROUND OF THE INVENTION

1. Field of the Invention

The present invention relates to a structure of a II-VI semiconductor laser device which has a stable lateral mode and is capable of oscillating with a low threshold current, and a method for fabricating the same.

2. Description of the Related Art

Semiconductor laser devices emitting blue or blue-green light using the double heterostructures consisting of II-VI compound semiconductor have been proposed. First of all, semiconductor laser devices having double heterostructures, in which ZnMgSSe or ZnSSe formed on a GaAs substrate serves as a cladding layer, have already been realized. Such semiconductor laser devices has been reported in "Electronics Letters", Vol. 29, No. 9 (1993), page. 766 or "The Journal of the Institute of Electronics, Information and Communication Engineers", July 1993, page 818. However, these devices have a problem that a current blocking function and light confinement in the direction parallel to the junction plane cannot be sufficient since the devices have stripe contact structures.

Therefore, "Electronics Letters", Vol. 29, No. 23, (1993) pp. 2041–2042, has reported the improvement of the disadvantage of the stripe contact structure: a resin buried ridge waveguide type semiconductor laser device structure adopted in a III-V semiconductor laser device of AlGaAs or the like (Japanese Laid-Open Patent Publication No. 63-122187) is applied to the abovementioned II-VI compound semiconductor. FIG. 4 is a cross-sectional view showing the buried ridge waveguide type semiconductor laser device. An n-GaAs substrate 21 is used as a substrate. A buffer layer 22, an n-MgZnSSe lower cladding layer 23, an n-ZnSSe layer 24, a CdZnSe quantum well active layer 25, a p-ZnSSe layer 26, a p-MgZnSSe upper cladding layer 27, a p-Zn(Se, Te) contact layer 28 are successively deposited on the n-GaAs substrate 21. On the both sides of a striped ridge 27a which is formed by partially etching the upper cladding layer 27 and the contact layer 28, a burying blocking layer 29 made of polyimide resin is deposited. Electrodes 2a and 20 are provided on the upper surface of the striped ridge 27a and the lower surface of the substrate 21, respectively. Although the electrode 2a is formed on the upper surface of the striped ridge 27a alone in FIG. 4, the electrode may be formed on the entire surface of the device. Even if the electrode is formed on the entire surface of the device, the device characteristics are not affected thereby.

A current flowing between the upper and the lower electrodes 2a and 20 is injected to a portion of the active layer under the striped ridge 27a alone owing to blocking effect of the polyimide resin burying blocking layer 29. Furthermore, since the upper cladding layer 27 other than the striped ridge 27a does not have a sufficient thickness to confine light therein, the light propagates through the striped ridge 27a alone. In this way, the buried ridge waveguide type semiconductor laser having the structure shown in FIG. 4 has both the current blocking mechanism and the optical waveguide mechanism.

In the ridge waveguide type semiconductor laser device shown in FIG. 4, however, satisfactory device characteristics cannot be obtained. Specifically, some of the problems such as poor mounting of devices, deterioration of a lifetime of devices, degradation of threshold value current characteristics and poor operation at high output occur. Thus, the conditions which are capable of solving all these problems could not be found.

SUMMARY OF THE INVENTION

The semiconductor laser device of this invention includes: a lower cladding layer; an upper cladding layer having a bottom and a strip-shaped ridge portion projecting from the bottom; a II-VI compound semiconductor active layer interposed between the lower cladding layer and the upper cladding layer; and a burying blocking layer made of an aromatic polyamide resin formed on a bottom of the upper cladding layer so as to be in contact with sides of the stripe-shaped ridge portion.

According to another aspect of the invention, a method for fabricating a semiconductor laser device includes the steps of: forming an upper cladding layer having a stripe-shaped ridge portion on a surface of a semiconductor wafer by partially etching the semiconductor wafer including a lower cladding layer, an upper cladding layer and a II-VI compound semiconductor active layer formed between the lower cladding layer and the upper cladding layer; applying a solution containing an aromatic polyamide resin on the surface of the semiconductor wafer so as to cover the stripe-shaped portion; performing a heat treatment on the semiconductor substrate at a temperature of 220° C. or lower so as to vaporize a solvent component contained in the solution, thereby forming an aromatic polyamide resin film on the surface of the semiconductor wafer; and removing at least the aromatic polyamide resin film formed on the stripe-shaped ridge portion.

Thus, the invention described herein makes possible the advantages of providing a II-VI semiconductor laser device emitting blue or blue-green light with a low oscillation threshold current and stable high output operation, which is capable of preventing the current from leaking into a region other than the oscillation region and controlling a fundamental lateral mode oscillation.

These and other advantages of the present invention will become apparent to those skilled in the art upon reading and understanding the following detailed description with reference to the accompanying figures.

DESCRIPTION OF THE PREFERRED EMBODIMENTS

The inventors of the present invention surmise that degradation in threshold value current characteristics and deterioration in light output of a semiconductor laser device are closely related to a heat treatment temperature in the fabrication process of the semiconductor laser element. Moreover, the inventors predict that poor mounting of laser chips and deterioration in a lifetime of devices are caused by the poorly cured polyimide resin.

Figure 4:
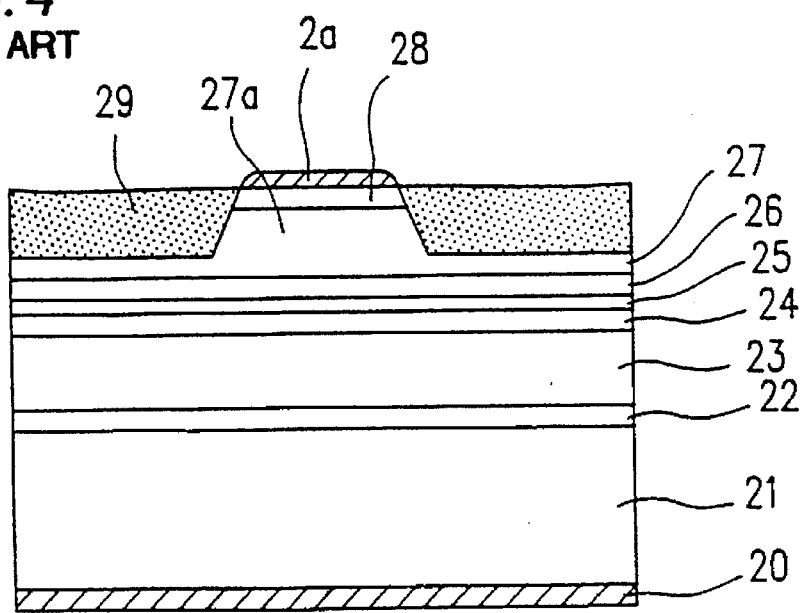
FIG. 4 is a cross-sectional view showing a conventional semiconductor laser device.

In the fabrication method of a ridge waveguide type II-VI semiconductor laser device using a burying blocking layer made of polyimide resin as shown in FIG. 4, a polyimide resin film is formed by the following process. An unpolymerized liquid polyimide material, which is dropped on the surface of a wafer, is subjected to a heat treatment so as to be polymerized and cured. However, a heating temperature required to form the sufficiently stable polyimide resin film exceeds 220° C. Such a temperature is equal to or higher than the temperature used for crystal Growth of II-VI semiconductor layers by an MBE method, that is, 220° C. to 300° C. Therefore, it is considered that a dopant is diffused or rendered ineffective in the semiconductor layer in the step of polymerizing and curing the polyimide material, thereby deteriorating the characteristics of a resultant laser device.

On the other hand, if the polyimide resin is subjected to a heat treatment at a temperature of 220° C. or lower in order to prevent the heat from affecting the device, the polyimide resin is not sufficiently cured. As a result, it is considered that the problems such as a decrease in a mounting yield of laser chips, deterioration of lifetime characteristics of the device due to insufficient mounting and the like may arise.

Therefore, the relationship between the heat treatment temperature of the polyimide resin forming the burying blocking layer and the characteristics of the II-VI semiconductor laser device is experimented and examined. The experiment shows the reason why the deterioration of characteristics of the semiconductor laser device, which is conventionally regarded as a problem, is caused. A dopant is diffused or rendered ineffective in the semiconductor layer which is subjected to a heat treatment at a temperature of 220° C. or higher. Such a phenomenon deteriorates the characteristics of the semiconductor laser device. Simultaneously, it is also found that the above phenomenon hardly occurs when a heat treatment temperature is set to 220° C. or lower. The detailed result of the experiment will be described below.

On the basis of the above result, the present inventors conclude that it is essential for improvement of the characteristics of the ridge waveguide type II-VI semiconductor laser device to newly select and apply the material of the burying blocking layer which can be sufficiently polymerized and cured at a temperature of 220° C. or lower.

However, in order to select and adopt the material of the burying blocking layer, it is necessary to satisfy several performances in view of the characteristics, the fabrication process and the yield of the semiconductor laser element aside from the above thermal characteristic. The performances are: (a) a sufficient function for blocking a current; (b) resistance against a solvent such as acetone; (c) good adherence to a metal constituting the electrodes so that the chip is not peeled off at the time of mounting; and (d) capability of preventing the deterioration of the semiconductor laser device from being accelerated.

As the result of comparison and examination of various resin materials as described below, it is found that an aromatic polyamide resin is the most suitable for a resin forming the burying blocking layer.

Hereinafter, an example of the present invention will be described further in detail with reference to FIGS. 1 to 3.

Figure 1:
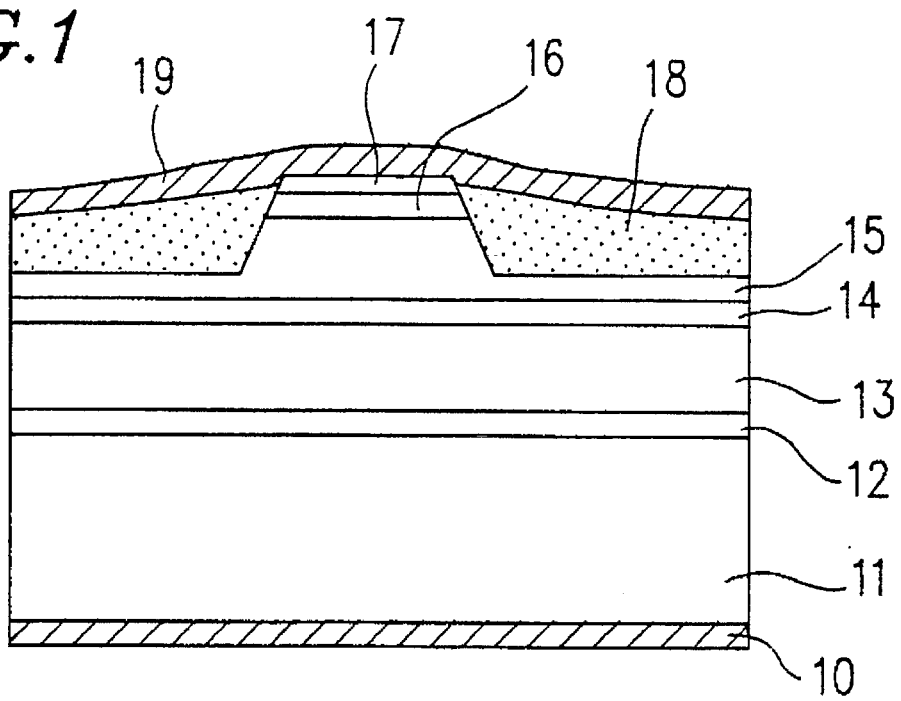
FIG. 1 is a cross-sectional view showing a semiconductor laser device of an example according to the present invention.
Figure 2A:
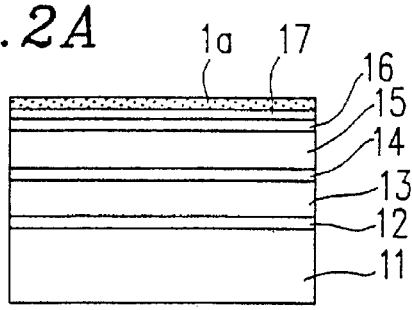
FIGS. 2A to 2F are cross-sectional views showing a fabrication process of the semiconductor laser device of the example according to the present invention.
Figure 2E:
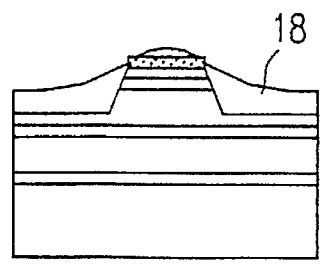
Figure 2B:
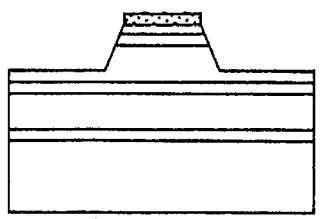
Figure 2C:
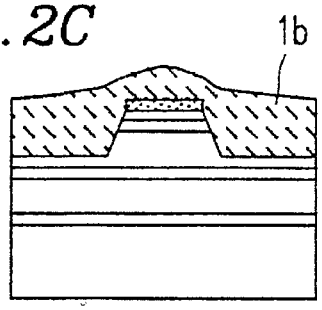
Figure 2F:
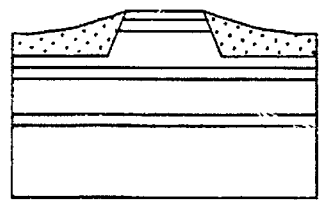

FIG. 1 is a cross-sectional view showing the structure of a semiconductor laser device in the example according to the present invention. The reference numeral 11 in FIG. 1 denotes an n-GaAs substrate. On the n-GaAs substrate 11, an n-ZnSe buffer layer 12, an n-MgZnSSe lower cladding layer 13, a CdZnSe/ZnSSe quantum well active multilayer 14, a p-MgZnSSe upper cladding layer 15, a p-ZnSSe first contact layer 16 and a p-Zn(Se, Te) second contact layer 17 are successively formed. The upper cladding layer 15 and the first and second contact layers 16 and 17 are etched into a striped ridge shape. An aromatic polyamide resin burying blocking layer 18 is formed on the upper surface of the upper cladding layer other than the striped portion and the both sides of the stripe-shaped ridge. A Pd/Pt/Au electrode 19 and an In electrode 10 are formed on the entire upper surface and the entire lower surface of the device, respectively.

Next, a method for fabricating the above-mentioned semiconductor laser device will be described with reference to cross-sectional views of FIGS. 2A to 2F showing the fabrication process.

First, the n-ZnSe buffer layer 12, the n-MGZnSSe lower cladding layer 13, the CdZnSe/ZnSSe quantum well active multilayer 14, the p-MgZnSSe upper cladding layer 15, the p-ZnSSe first contact layer 16 and the p-Zn(Se, Te) second contact layer 17 are epitaxially grown on the n-GaAs substrate 11 (Si dope: $3 \times 10^{18}$ cm$^{-3}$) by an MBE method. The quantum well active multilayer 14 consists of a CdZnSe well layer and a ZnSSe cladding layer. Furthermore, an SiO$_2$ layer 1a having a thickness of 0.2 μm is formed on the surface of the wafer by an electron beam evaporation method (FIG. 2A). In this case, compositions, thicknesses and doping concentrations of the respective semiconductor layers are determined as shown in Table 1 as an example.

TABLE 1

| | Composition | Thickness | Doping concentration |
|---|---|---|---|
| Buffer layer 12 | ZnSe | 0.1 μm | Cl: $2 \times 10^{18}$ cm$^{-3}$ |
| Lower cladding layer 13 | Mg$_{0.1}$Zn$_{0.9}$S$_{0.14}$Se$_{0.86}$ | 1.5 μm | Cl: $5 \times 10^{17}$ cm$^{-3}$ |
| Quantum well active multilayer 14 | Cd$_{0.1}$Zn$_{0.9}$Se/ ZnS$_{0.07}$Se$_{0.93}$ | 8 nm × 2(layers) and 10 nm × 3(layers) | Undoped |
| Upper cladding layer 15 | Mg$_{0.1}$Zn$_{0.9}$S$_{0.14}$Se$_{0.86}$ | 1.0 μm | N: $3 \times 10^{17}$ cm$^{-3}$ |
| First contact layer 16 | ZnS$_{0.07}$Se$_{0.93}$ | 0.1 μm | N: $7 \times 10^{17}$ cm$^{-3}$ |
| Second contact layer 17 | ZnSe | 0.1 μm | N: $2 \times 10^{18}$ cm$^{-3}$ |

Next, the SiO$_2$ layer 1a, the upper cladding layer 15, the first contact layer 16 and the second contact layer 17 are partially removed from the surface of the SiO$_2$ layer 1a using normal photolithography and etching techniques until the thickness of the upper cladding layer 15 other than the stripe-shaped portion is reduced to 0.3 μm. As a result, a stripe-shaped ridge structure as shown in FIG. 2B is fabricated. The width of the stripe-shaped ridge is 3 μm. In this way, an upper cladding layer having a bottom face and a stripe-shaped ridge portion projecting from the bottom face is formed.

Thereafter, an aromatic polyamide resin solution is dropped onto the surface of the wafer, and is applied onto the entire surface of the wafer by a spin coating method. As the aromatic polyamide resin solution, HL-1210 (produced by Hitachi Chemical Co., Ltd.), for which diglyme is used as a solvent. Since a spin coating method is used in this example, the aromatic polyamide resin solution is applied so as to be thinner on the upper part of the strip-shaped ridge than on the etched surfaces of both sides of the strip-shaped ridge. Sequentially, the wafer is subjected to preheating for holding the wafer for 10 minutes in an oven maintained at 90° C., and is further subjected to a heat treatment for holding the wafer for one hour in an oven maintained at 180° C., thereby vaporizing and removing the solvent in the resin solution. As a result, the aromatic polyamide resin film is formed as shown in FIG. 2C. The preheat treatment is performed in order to prevent bubbles from being confined in the resin film due to sudden rise of the temperature. The thickness of the aromatic polyamide resin film 1b thus formed is about 0.7 µm on the etched surface of the both sides of the strip-shaped ridge.

Figure 2D:
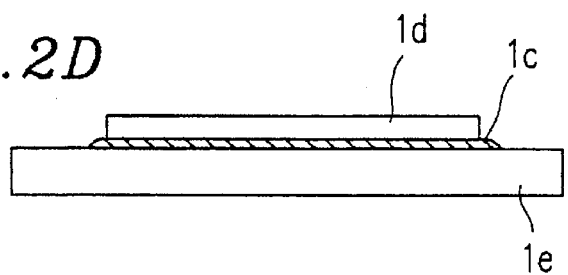
Figure 3:
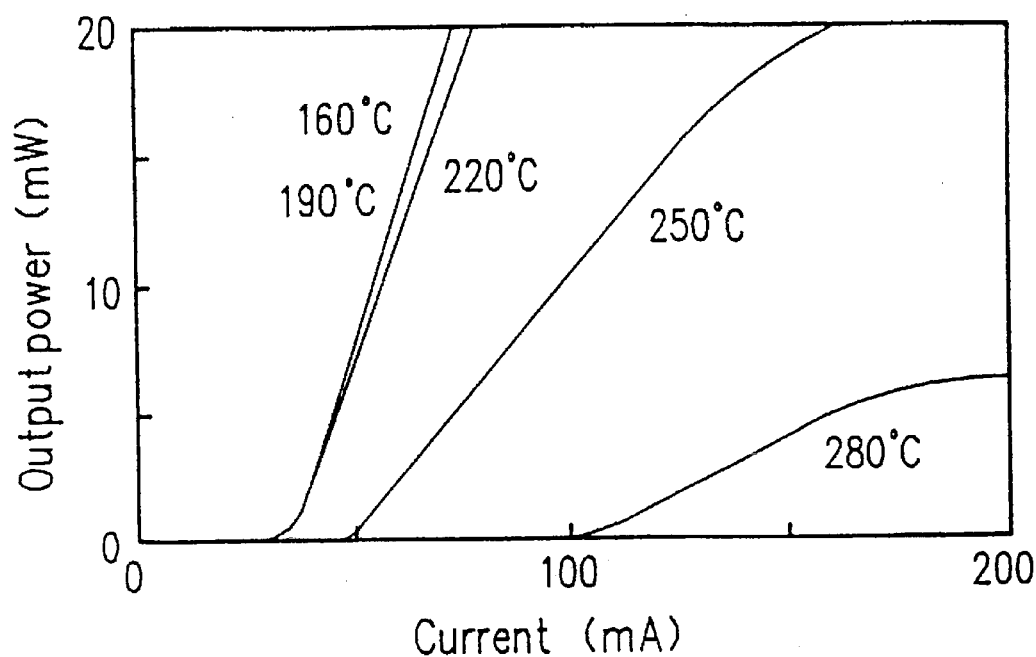
FIG. 3 is a graph showing fabrication conditions of the semiconductor laser device of the example according to the present invention.

Subsequently, a wafer 1d is attached to a glass plate 1e using a wax 1c so that the bottom face (the substrate side) is upwardly placed as shown in FIG. 2D. Then, the wafer 1d is polished until the total thickness is reduced to be about 100 µm. This process is conducted for adjusting the thickness of the wafer so that mirror faces of the laser device can be easily fabricated by cleavage.

Next, after removing the wafer 1d from the glass plate 1e, the wax and an abrasive material which are adhered to the wafer 1d is removed by acetone. Ultrasonic cleaning is completed within a short time, i.e., about 10 minutes so as to prevent the aromatic polyamide resin blocking layer from being damaged by acetone.

Thereafter, the aromatic polyamide resin film 1b is uniformly etched by plasma oxidation stripping in an oxygen plasma so that the aromatic polyamide resin 1b is substantially removed from the upper surface of the strip-shaped ridge and remains on the etched surfaces on the both sides of the stripe-shaped ridge as shown in FIG. 2E. The thickness of the aromatic polyamide resin burying blocking layer 18 other than on the stripe-shaped ridge results to be about 0.4 µm.

Furthermore, the wafer 1d is immersed into dilute hydrofluoric acid (4%) for 30 seconds. The partially remaining aromatic polyamide resin is removed with an $SiO_2$ layer 1a from the upper surface of the stripe-shaped ridge. As a result, the wafer as shown in FIG. 2F is formed.

Subsequently, Pd/Pt/Au and In are deposited by an evaporation method on the upper surface and the lower surface of the wafer so as to form electrodes 19 and 10, respectively, thereby completing the semiconductor laser device having the structure shown in FIG. 1.

As described above, since the portion in contact with the surface side electrode (Pd/Pt/Au) on the surface of the semiconductor wafer is protected by the $SiO_2$ film 1a immediately before the deposition of the surface electrode, the portion is not contaminated during a wafer polishing process and the like. Therefore, the portion can come in good electrical contact with the deposited electrode metal. Since the semiconductor on the bottom face is n-GaAs which easily comes in good electrical contact with the electrode metal and the contact area of the portion and the electrode metal is large, contamination during the process does not matter. Thus, even if the organic cleaning after polishing is insufficiently conducted for a short period of time in order to prevent the aromatic polyamide resin from being damaged, the problems concerning the characteristics of the device do not arise. As described above, according to the present example, in addition to the capability of fabricating the burying blocking layer by simple processes, i.e., a spin coating method and an ashing treatment, it is possible to fabricate a ridge waveguide type semiconductor laser device with a one-step crystal growth.

By using the wafer thus obtained, a semiconductor laser device having cleaved mirror faces and a cavity length of 350 µm is fabricated. As a result, an oscillation threshold value of 35 mA is obtained, and no kink is found in a current—light output curve up to the light output of 20 mW. Moreover, the device is operating in a stable single lateral mode. On the basis of this result, it is understood that the region where the current flows is limited and the mode control is well performed. An oscillation wavelength is 480 nm in this case. Furthermore, although a lot of chips are peeled off when laser chips are mounted in the case of a conventional example where the insufficiently cured polyimide resin due to a low temperature treatment is used as a burying blocking layer, such a problem does not arise in the semiconductor laser device of the present example.

Next, the result of the experimental examination of the relationship between a heat treatment temperature of a resin forming the burying blocking layer and the characteristics of the II-VI compound laser device will be described in detail. Taking a heat treatment temperature of the aromatic polyamide resin solution as a parameter from the fabrication processes of the semiconductor laser of the above-mentioned example, five kinds of devices are fabricated while setting temperatures to 160° C., 190° C., 220° C., 250° C. and 280° C., respectively. Then, current—light output characteristics thereof are compared. The result is shown in FIG. 3. Each of the devices treated at the temperatures of 220° C. or lower demonstrates good device characteristics, i.e., the lowest oscillation threshold value and the highest differential efficiency among five kinds of devices. However, as the heat treatment temperature rises to 250° C. and 280° C., the oscillation threshold value increases and the differential efficiency is lowered. As a result, it is found that the device characteristics are deteriorated. From this result, it is proved that the heat treatment temperature of the resin solution suffices to be 220° C. or lower. However, it is needless to say to select the temperature at which the solvent component of the aromatic polyamide resin solution can be sufficiently vaporized and removed. When the temperature is selected, it is necessary to take the boiling point of the solvent into consideration. Since diglyme whose boiling point is about 162° C. is used in the present example, 180° C., which is slightly higher than the boiling point, is selected as the heat treatment temperature.

The reason why the aromatic polyamide resin is selected as the most suitable resin for forming the burying blocking layer will be described in detail. In a semiconductor process, various resin materials are generally used for a resist, an interlayer insulating film, a step planarizing film and a passivation film. All these resin materials can be applied onto the surface of the wafer by a simple method such as a spin coating. Among the films, since the interlayer insulating film and the step planarizing film are used in an IC process, they are required to have the resistance at a high temperature. Therefore, there is no resin material of which the film is formed at a low temperature (220° C. or lower). The polyimide resin, which is shown as a conventional example, is included in such resin materials. Among the passivation film materials, the film can be formed of the aromatic polyamide resin at a low temperature. The film can be formed of any resist material at low temperature. The resist materials, which are generally used at present and are easily available, are as follows: a novolak resin as a positive type resist; a cyclized rubber resin as a negative type resist; a phenolic resin as both positive and negative types; and a PMMA (polymethacrylic acid methyl) mainly used as an electron beam resist.

The above-mentioned five kinds of resins which are capable of being grown at a low temperature are used for the burying blocking layer of the semiconductor laser described in the example. Table 2 shows the result of comparison and examination of the characteristics thereof. The resin film is formed by a heat treatment at 180° C. in this case. In Table 2, the adherence of the electrode metal represents whether the laser device is sufficiently mounted or not. The resistance against organic solution represent the resistance against acetone. Furthermore, the lifetime of device represents a relative lifetime between the devices using the respective resins. Based on the result of the experiment, it is found that the aromatic polyamide resin is suitable for the burying blocking layer of the semiconductor laser device except for somewhat poor resistance against the organic solution. However, the lack in resistance against the organic solution to some degree does not become a problem when a cleaning step for a short period of time as shown in the example is used.

As described above, by using the aromatic polyamide resin for the burying blocking layer of the semiconductor laser device in the present invention, it is possible to conduct a heat treatment of the burying blocking layer at a temperature of 220° C. or lower. Furthermore, since the semiconductor laser device is configured so as to have the stripe-shaped ridge and the burying blocking layer, a current is injected to the stripe-shaped ridge alone. Therefore, the current is prevented from leaking into the region other than the laser oscillating region. Furthermore, since the upper cladding layer other than the stripe-shaped ridge is formed to have a thickness which is insufficient to confine the light therein, the light propagates through the stripe-shaped ridge alone. Therefore, it is possible to realize the laser oscillation in a stable lateral mode.

Moreover, by conducting a heat treatment of the burying blocking layer at 220° C. or lower, the dopant is neither diffused nor rendered ineffective in the II-VI compound semiconductor layer. Thus, the ridge waveguide type semiconductor laser device can be fabricated without deteriorating the device characteristics due to heat history in the fabrication process.

TABLE 2

|  | Adherence to electrode metal | Resistance against organic solution | Current blocking function | Device lifetime |
|---|---|---|---|---|
| Aromatic polyamide resin | o | Δ | o | o |
| Novolak resin | x | x | o | Δ |
| Cyclized rubber resin | x | Δ | o | Δ |
| Phenolic resin | x | x | o | Δ |
| PMMA resin | x | x | o | Δ |

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor laser device, comprising the steps of:

forming an upper cladding layer having a stripe-shaped ridge portion on a surface of a semiconductor wafer by partially etching the semiconductor wafer including a lower cladding layer, an upper cladding layer and a II-VI compound semiconductor active layer formed between the lower cladding layer and the upper cladding layer;

applying a solution containing an aromatic polyamide resin on the surface of the semiconductor wafer so as to cover the stripe-shaped portion;

performing a heat treatment on the semiconductor substrate at a temperature of 220° C. or lower so as to vaporize a solvent component contained in the solution, thereby forming an aromatic polyamide resin film on the surface of the semiconductor wafer; and removing at least the aromatic polyamide resin film formed on the stripe-shaped ridge portion.

2. A method for fabricating a semiconductor laser device according to claim 1, wherein the solvent component is diglyme.

3. A method for fabricating a semiconductor laser according to claim 1, wherein the temperature of the heat treatment is equal to or higher than a boiling point of the solvent component of the solution containing the aromatic polyamide resin.

4. A method for fabricating a semiconductor laser device according to claim 1, further comprising the steps of:

forming a dielectric film on the surface of the semiconductor wafer prior to the step of forming the upper cladding layer having the strip-shaped ridge portion; and removing the dielectric film formed on the upper surface of the stripe-shaped ridge portion after the step of removing the aromatic polyamide resin film formed on the stripe-shaped ridge portion.

5. A method for fabricating a semiconductor laser device according to claim 4, further comprising the step of polishing the bottom face of the semiconductor wafer after the step of forming the aromatic polyamide resin film on the surface of the semiconductor wafer.

* * * * *